(12) United States Patent
Schoonenberg et al.

(10) Patent No.: US 11,469,013 B2
(45) Date of Patent: Oct. 11, 2022

(54) COMBINATION OF AN ELECTRICITY CONDUCTING ELEMENT, SUCH AS BUSHING, AND A CONNECTOR CABLE

(71) Applicant: Eaton Intelligent Power Limited, Dublin (IE)

(72) Inventors: Gerard Schoonenberg, CR Hengelo (NL); Arend Lammers, TV Hengelo (NL); Elisabeth Morskieft, EA Hengelo (NL); Amritendu Das, West Bengal Pin (IN); Ranjit Jadhav, Pune (IN)

(73) Assignee: Eaton Intelligent Power Limited, Dublin (IE)

(*) Notice: Subject to any disclaimer, the term of this patent is extended or adjusted under 35 U.S.C. 154(b) by 715 days.

(21) Appl. No.: 16/469,150

(22) PCT Filed: Dec. 11, 2017

(86) PCT No.: PCT/EP2017/082254
§ 371 (c)(1),
(2) Date: Jun. 13, 2019

(87) PCT Pub. No.: WO2018/108828
PCT Pub. Date: Jun. 21, 2018

(65) Prior Publication Data
US 2020/0020466 A1    Jan. 16, 2020

(30) Foreign Application Priority Data
Dec. 16, 2016  (IN) .............................. 201611043046

(51) Int. Cl.
| H01B 17/00 | (2006.01) |
| G01R 15/16 | (2006.01) |
| G01R 15/18 | (2006.01) |

(52) U.S. Cl.
CPC .......... *H01B 17/005* (2013.01); *G01R 15/16* (2013.01); *G01R 15/181* (2013.01)

(58) Field of Classification Search
None
See application file for complete search history.

(56) References Cited

U.S. PATENT DOCUMENTS

| 3,396,339 A | 8/1968 | Miram |
| 6,850,399 B1 * | 2/2005 | Kato ..................... H01H 33/027 361/132 |

(Continued)

FOREIGN PATENT DOCUMENTS

| EP | 0917157 A2 | 5/1999 |
| EP | 1113277 A1 | 7/2001 |

*Primary Examiner* — Jas A Sanghera
(74) *Attorney, Agent, or Firm* — Leydig, Voit & Mayer, Ltd.

(57) ABSTRACT

A combination includes: an electricity conducting element and a connector cable. The electricity conducting elements includes: a body of insulating material; an electrical conductor extending through the body; at least one passive electrical sensor embedded or integrated in the body of insulating material; and at least one shielded connector with one or more terminals arranged on an outer surface of the body, the at least one shielded connector being electrically connected to the at least one passive electrical sensor. The connector cable includes: a first shielded connector with one or more terminals for connecting with the at least one shielded connector; a second shielded connector with one or more terminals for connecting with an appliance or a further connector cable; and electrical components arranged closely to the first shielded connector and electrically connected to the terminals of the first shielded connector.

17 Claims, 3 Drawing Sheets

(56) References Cited

U.S. PATENT DOCUMENTS

| | | | | |
|---|---|---|---|---|
| 2001/0048308 A1* | 12/2001 | Potter | ............... | G01R 15/16 |
| | | | | 324/519 |
| 2011/0031980 A1* | 2/2011 | Kruger | ............... | H01F 27/402 |
| | | | | 324/547 |
| 2014/0368215 A1* | 12/2014 | Hoffman | ............... | G01R 15/14 |
| | | | | 324/552 |
| 2016/0005511 A1* | 1/2016 | Gravermann | ............... | H01R 9/0515 |
| | | | | 29/829 |
| 2016/0154051 A1* | 6/2016 | Watson | ............... | G01R 15/14 |
| | | | | 324/552 |

* cited by examiner

COMBINATION OF AN ELECTRICITY CONDUCTING ELEMENT, SUCH AS BUSHING, AND A CONNECTOR CABLE

CROSS-REFERENCE TO PRIOR APPLICATIONS

This application is a U.S. National Phase application under 35 U.S.C. § 371 of International Application No. PCT/EP2017/082254, filed on Dec. 11, 2017, and claims benefit to Indian Patent Application No. IN 201611043046, filed on Dec. 16, 2016. The International Application was published in English on Jun. 21, 2018 as WO 2018/108828 A1 under PCT Article 21(2).

FIELD

The invention relates to a combination of an electricity conducting element, such as a bushing, with integrated passive sensors (e.g. U, I, T) and a connector cable.

BACKGROUND

In medium and high voltage applications, a bushing allows an electrical conductor to pass safely through a grounded conducting barrier such as a switchgear housing. It is also known to integrate a current sensor and a voltage sensor in the bushing to be able to measure the current in and voltage at the electrical conductor.

Such a bushing is for example known from EP 0917157. This publication discloses a bushing in which a Rogowski coil and a capacitive voltage divider are arranged to measure current and voltage respectively. An electrical cylindrical screen is arranged around the electrical conductor, which screen functions in combination with the dielectric epoxy material of the body and a metal element spaced apart from the screen, as a first capacitor. The signal of this first capacitor is fed via a connector arranged on the outside of the body of the bushing and via a connector cable to a sensor electronics controller at a distance from the bushing. The sensor electronics controller has a second capacitor which forms in combination with the first capacitor a capacitive voltage divider to measure the voltage in the electrical conductor running through the bushing. However, due to the electrical field generated by the current running through the electrical conductor, the signal of the first capacitor is disturbed resulting in a low accuracy for the voltage measurements.

The known bushing has furthermore a Rogowski coil. In order to obtain a signal of a few hundred millivolts, a substantial amount of windings needs to be accommodated in the bushing, making the bushing more bulky in size, costly and difficult integrate.

Rogowski coils, wherein the windings are provided on printed circuit boards (PCB's) are also known and can be integrated in bushings, or placed on a defined distance from the main conductors. The disadvantage of PCB-based Rogowski coils is that the signal is only a few millivolts. Such a signal is easily disturbed by the electrical field generated by the voltage at the electrical conductors, which requires that the sensor electronics controller should also integrated with the sensor, e.g. into the bushing, to provide accurate measurements. This integration prevents any adjustments to the sensor electronics controller or replacement of parts, when the sensor electronics controller is embedded into the epoxy material of the body.

SUMMARY

In an embodiment, the present invention provides a combination, comprising: an electricity conducting element, comprising: a body of insulating material; an electrical conductor extending through the body; at least one passive electrical sensor embedded or integrated in the body of insulating material; and at least one shielded connector with one or more terminals arranged on an outer surface of the body, the at least one shielded connector being electrically connected to the at least one passive electrical sensor, and a connector cable, comprising: a first shielded connector with one or more terminals configured to connect with the at least one shielded connector; a second shielded connector with one or more terminals configured to connect with an appliance or a further connector cable; and electrical components arranged closely to the first shielded connector and electrically connected to the terminals of the first shielded connector, the electrical components being arranged at a distance from the second shielded connector and being electrically connected via a cable to the terminals of the second shielded connector.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
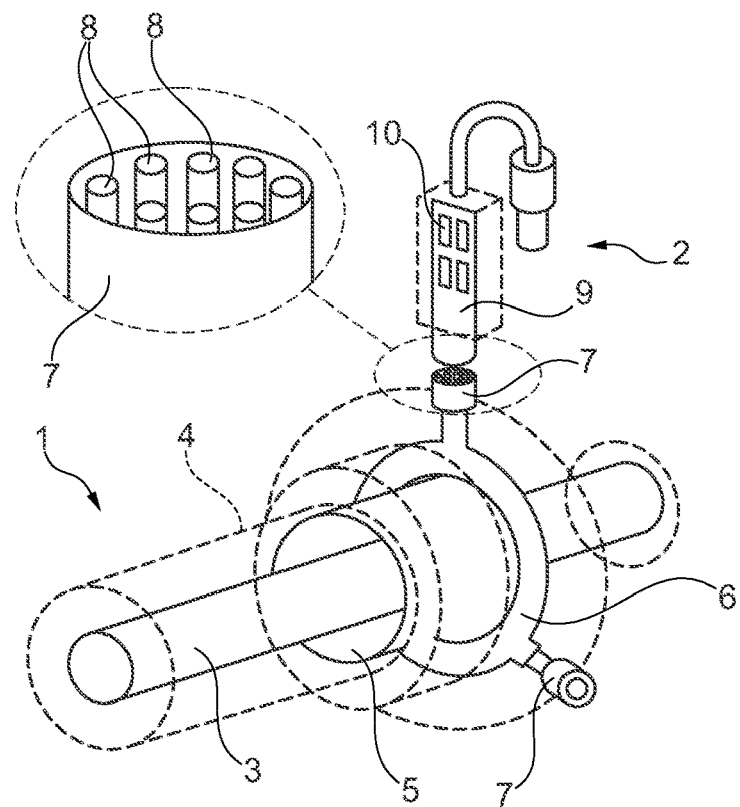
FIG. 1 shows a perspective view of an embodiment of the combination according to the invention with cut-away portions.

In an embodiment, the present invention reduces or even removes the above disadvantages.

In an embodiment, the present invention provides a combination of an electricity conducting element, such as a bushing, and a connector cable, wherein the electricity conducting element comprises:
a body of solid insulating material, such as dielectric epoxy material;
an electrical conductor extending through the body;
at least one passive electrical sensor, such as a Rogowski coil or voltage sensor, embedded or integrated in the solid insulating material of the body,
at least one shielded connector with one or more terminals arranged on the outer surface of the body and wherein the shielded connector is electrically connected to the at least one passive electrical sensor,
wherein the connector cable comprises:
a first shielded connector with one or more terminals for connection with the at least one shielded connector of the electricity conducting element;

a second shielded connector with one or more terminals for connection with an appliances or a further connector cable;

electrical components arranged closely to the first shielded connector and electrically connected to the terminals of the first shielded connector, and wherein the electrical components are arranged at a distance from the second shielded connector and are electrically connected via a cable to the terminals of the second shielded connector.

By providing a shielded connector on the electricity conducting element and having the electrical components closely to the first shielded connector of the connector cable, which first shielded connector is connected to the shielded connector of the electricity conducting element, the influence of possibly interfering fields, like the electrical field generated by the voltage at the electrical conductors, on the sensor measurements is virtually eliminated, because the electrical components are arranged as closely to the electricity conducting element as possible and are shielded, while still being removable due to the connectors. As a result sensors providing low output voltages can be used. Such sensors typically are small in size and only minimally affect the shape of the electricity conducting element.

Because the electrical components can be easily removed, the electricity conducting element no longer needs to be disassembled and replaced when some of the electrical components malfunctions or an update needs to be implemented. Such replacement is at least required at the end of life of the electrical components, which is (generally after 15 years. With the invention, only the connector cable needs to be replaced, which can be done in very limited time, and without the need for de-energizing the primary circuits In a preferred embodiment of the combination according to the invention the at least one electrical sensor comprises a cylindrical electrical screen arranged concentrically around and spaced apart from the electrical conductor, wherein the electrical screen is electrically connected to a terminal of the shielded connector.

A second plug could be arranged for earthing the cylindrical screen to prevent floating when the first and second connectors are disconnected.

A conducting screen integrated at a fixed distance from the primary conductor can be used as primary part of the voltage measuring capacitance. The combination forms the primary capacitance of a capacitive voltage divider.

By having the electrical screen directly connected to a terminal of the shielded connector of the electricity conducting element, the signal of the electrical screen can be directly fed to the electrical components of a connected connector cable, such that the signal of the electrical screen can be processed into a more robust signal and fed further along the second shielded connector.

Preferably, the electrical components comprise a capacitor electrically connected with the (cylindrical) electrical screen to form a capacitive voltage divider.

By having the capacitor being part of the electrical components and not embedded in the body of the electricity conducting element, it is possible to adjust the capacitive voltage divider by exchanging the capacitor of the electrical components.

In another embodiment of the combination according to the invention the at least one electrical sensor comprises a Rogowski coil wherein each end of the Rogowski coil is electrically connected to a separate terminal of the shielded connector.

A typical Rogowski coil for an electricity conducting element, such as a bushing, is either bulky to provide a sufficient high voltage, which is not easily disturbed by the electrical field, or is small but then provides a low voltage, which is easily disturbed. In the latter case additional electronics need to be integrated in the bushings according to the prior art.

However with the combination according to the invention these additional electronics can be provided in the electrical components of the connector cable. Apart from the possibility for a smaller design of the Rogowski coil, the electrical components required to provide a robust current signal can be arranged in the connector cable, which allows for easy replacement or updating when required.

Preferably, the windings of the Rogowski coil are arranged on a printed circuit board and wherein the at least one shielded connector is also arranged on the printed circuit board.

A PCB based Rogowski coil is cost effective, but typically generates a low voltage. However, with the shielded connectors and the electrical components arranged closely to the first shielded connector of the connector cable, the influences of the electrical field are virtually canceled such that the electrical components can easily process the signal of the Rogowski coil into a robust signal which can be fed to further appliances.

In yet another embodiment the at least one electrical sensor comprises a temperature sensor embedded in the insulating material and the temperature sensor is electrically connected to the one or more terminals of the shielded connector.

With high voltage and current applications, the insulating material, such as dielectric epoxy material of the body can heat up substantially, which heat influences the characteristics of the dielectric epoxy material, for example by the expansion of the material when heated. To take these changes into account, the temperature sensor can register the temperature of the epoxy material and these readings can be incorporated by the electrical components in the connector cable to provide more accurate signals for current and voltage.

In yet another embodiment of the combination according to the invention two or more shielded connectors are arranged on the outer surface of the body and distributed over the circumference of the body, wherein each of the shielded connectors is electrically connected to the at least one electrical sensor.

By arranging two or more shielded connectors on the electricity conducting element, the orientation of the electricity conducting element during assembly is less relevant, as there will always be a connector more conveniently positioned for coupling with the connector cable.

In a very preferred embodiment of the combination according to the invention the electrical components comprise an analog-to-digital converter for converting the signals of the at least one sensor of the bushing into a digital signal, which is supplied to the one or more terminals of the second shielded connector of the connector cable.

With the invention, the influence of the electrical field is reduced or even removed for the signals between the sensors in the electricity conducting element and the electrical components in the connector cable. By digitizing the signals processed by the electrical components, also the signals which are fed to further appliances are no longer influenced by the electrical field.

In yet another embodiment of the combination according to the invention the electrical components comprise an amplifier for amplifying the signals of the at least one sensor of the electricity conducting element.

In still a further embodiment of the combination according to the invention the connector cable further comprises an elongate housing for housing the electrical components, wherein the first shielded connector is arranged to one end of the housing and wherein the cable with the second shielded connector is arranged to the other end of the housing.

With such a housing, the electrical components are easily integrated in a connector cable, while the electrical components still can be arranged close to the first shielded connector of the connector cable.

FIG. 1 shows a perspective view of an embodiment of the combination according to the invention with a bushing 1 and a connector cable 2. The bushing 1 has an electrical conductor 3 which is embedded in a dielectric epoxy material body 4 (shown in dashed lines) (see also FIG. 4).

Concentrically arranged with the electrical conductor 3 is a cylindrical screen 5 and an annular printed circuit board 6 with tracks providing a Rogowski coil. The cylindrical screen 5 is connected to the printed circuit board 6, which in turn comprises two shielded connectors 7 arranged with their longitudinal axis in radial direction. The shielded connectors 7 have terminals 8 to which the circuit board 6 with Rogowski coil and cylindrical screen 5 are electrically connected.

Figure 2:
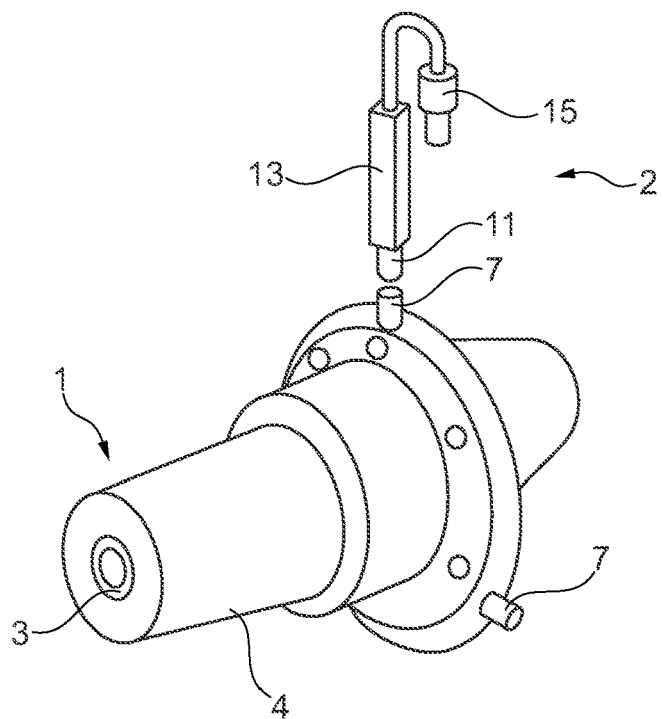
FIG. 2 shows a perspective view of the embodiment of FIG. 1.

As shown also in FIG. 2, the shielded connectors extend out of the dielectric epoxy material body 4, which allows for connection with the connector cable 2.

Figure 3:
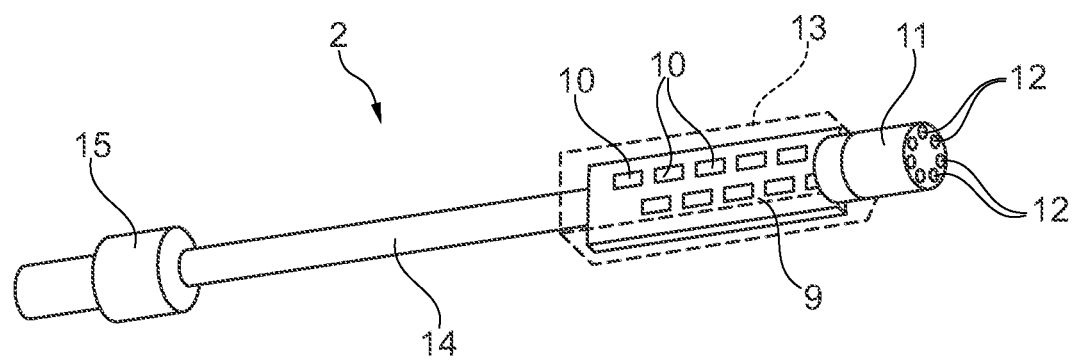
FIG. 3 shows the connector cable of the embodiment of FIG. 1 in more detail.

The connector cable 2 (see also FIG. 3) has printed circuit board 9 with electrical components 10. Arranged on the printed circuit board 9 is also a first shielded connector 11 with terminals 12, which connect to the terminals 8 of the shielded connector 7. Because the first shielded connector 11 is arranged closely to the electrical components 10 and as the housing 13 provides further shielding, even low voltage signals originating from the cylindrical screen 5 and the Rogowski coil on the printed circuit board 6 can be processed by the electrical components 10 without disturbance by the electrical field generated by the electrical conductor 3.

The connector cable 2 further comprises a flexible cable 14 to which a second shielded connector 15 is arranged for connection to further appliances.

Figure 4:
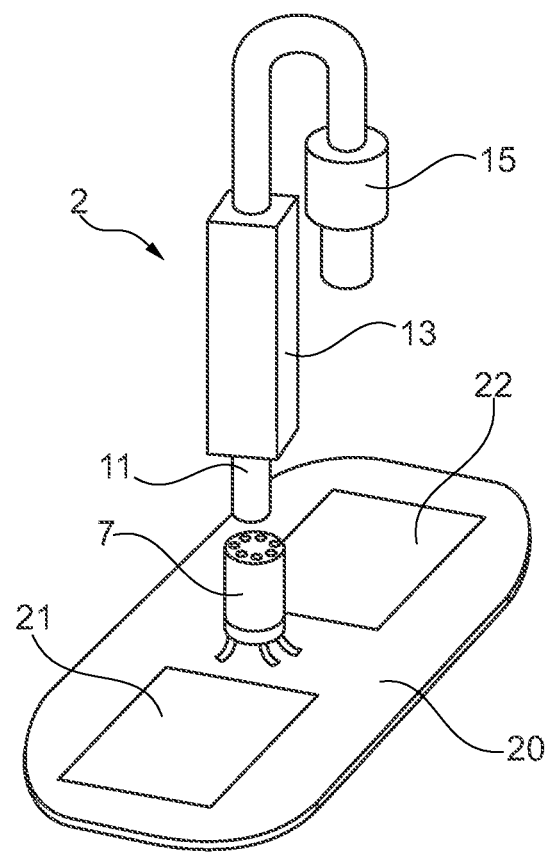
FIG. 4 shows a perspective view of parts of a second embodiment of the invention.

FIG. 4 shows a perspective view of parts of a second embodiment of the invention with a shielded connector 7 similar to the embodiment shown in FIGS. 1 and 2. A flat printed circuit board 20 is arranged to the shielded connector 7 and intended to be embedded in the dielectric epoxy material body of a bushing.

As the low voltage signals of sensors arranged in the bushing are directly processed by the electrical components 10 in the housing 13 of the connector cable 2 and because these low voltage signals are not disturbed by the electrical field of the electrical conductor, it is possible to further reduce the size of the sensors. This allows for a small Rogowski coil 21 and a small capacitor plate 22 to be arranged on the flat printed circuit board 20 to provide a current sensor and a voltage sensor respectively. This reduction in size of the sensors 21, 22 provides further design freedom for the bushing.

Figure 5:
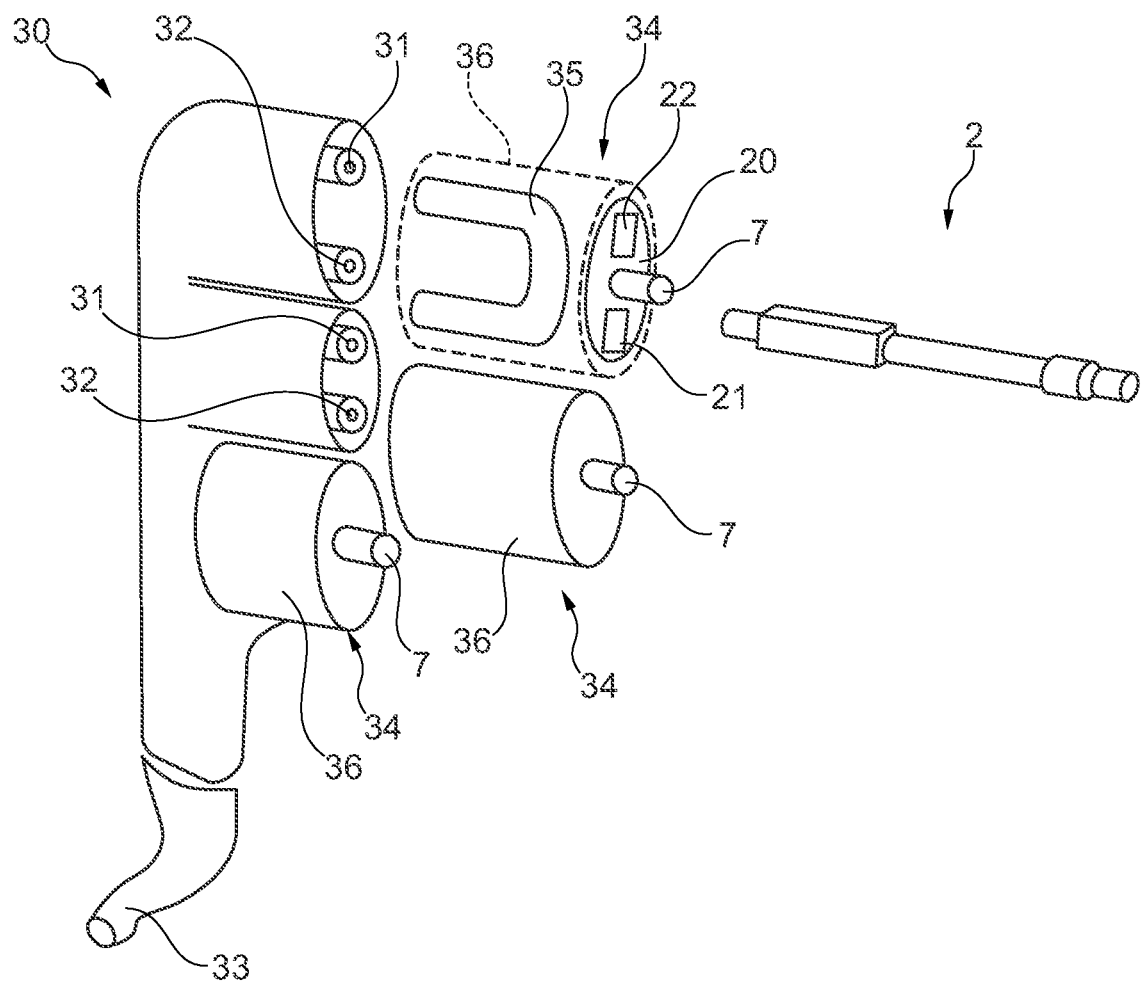
FIG. 5 shows the second embodiment in perspective view.

FIG. 5 shows the second embodiment 30 of the invention. This embodiment 30 is switchgear in which the busbar contacts 31 are connected to the main contacts 32, which are in turn connected to a cable 33, with a switch cap 34.

Each switch cap 34 has a U-shaped electrical conductor 35 arranged in a body 36 of dielectric epoxy material. The U-shaped electrical conductor 35 connects the busbar contact 31 with the corresponding main contact 32, when mounted.

Each switch cap 34 further has a printed circuit board 20, as shown in FIG. 4, integrated in the epoxy material body 36 near the base of the U-shaped electrical conductor 35. Only the shielded connector 7 extends out of the switch cap 34, such that a connector cable 2 can be easily connected.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A combination, comprising:
   an electricity conducting element, comprising:
     a body of insulating material;
     an electrical conductor extending through the body;
     at least one passive electrical sensor embedded or integrated in the body of insulating material; and
     at least one shielded connector with one or more terminals arranged on an outer surface of the body, the at least one shielded connector being electrically connected to the at least one passive electrical sensor; and
   a connector cable, comprising:
     a first shielded connector with one or more terminals configured to connect with the at least one shielded connector, the one or more terminals of the first shielded connector being shielded from one or more electric fields external to the connector cable;
     a second shielded connector with one or more terminals configured to connect with an appliance or a further connector cable, the one or more terminals of the second shielded connector being shielded from the one or more electric fields external to the connector cable; and
     electrical components arranged directly adjacent to the first shielded connector and electrically connected to the terminals of the first shielded connector, the electrical components being arranged at a distance from the second shielded connector further than a distance to the first shielded connector and being electrically connected via a cable to the terminals of the second shielded connector.

2. The combination according to claim 1, wherein the at least one electrical sensor comprises a cylindrical electrical screen arranged concentrically around and spaced apart from the electrical conductor, and
wherein the electrical screen is electrically connected to a terminal of the shielded connector.

3. The combination according to claim 2, wherein the electrical components comprise a capacitor electrically connected with the cylindrical electrical screen to form a capacitive voltage divider.

4. The combination according to claim 1, wherein the at least one electrical sensor comprises a Rogowski coil, and
wherein each end of the Rogowski coil is electrically connected to a separate terminal of the shielded connector.

5. The combination according to claim 4, wherein windings of the Rogowski coil are arranged on a printed circuit board, and
wherein the at least one shielded connector is arranged on the printed circuit board.

6. The combination according to claim 1, wherein the at least one electrical sensor comprises a temperature sensor embedded in the body of insulating material, and
wherein the temperature sensor is electrically connected to the one or more terminals of the shielded connector.

7. The combination according to claim 1, wherein two or more shielded connectors are arranged on the outer surface of the body and distributed over a circumference of the body, and
wherein each of the shielded connectors is electrically connected to the at least one electrical sensor.

8. The combination according to claim 1, wherein the electrical components comprise an analog-to-digital converter configured to convert signals of the at least one sensor of the electricity conducting element into a digital signal, which is supplied to the one or more terminals of the second shielded connector of the connector cable.

9. The combination according to claim 1, wherein the electrical components comprise an amplifier configured to amplify signals of the at least one sensor of the electricity conducting element.

10. The combination according to claim 1, wherein the connector cable further comprises an elongate housing configured to house the electrical components,
wherein the first shielded connector is arranged to one end of the housing, and
wherein the cable with the second shielded connector is arranged to another end of the housing.

11. The combination according to claim 1, wherein the electricity conducting element comprises a bushing, and
wherein the electrical conductor extends in a longitudinal direction through the body.

12. The combination according to claim 1, wherein the electricity conducting element comprises a bushing.

13. The combination according to claim 1, wherein the body of insulating material comprises a dielectric epoxy material.

14. The combination according to claim 1, wherein the at least one passive electrical sensor comprises a Rogowski coil or a primary part of a capacitive voltage divider.

15. A combination, comprising:
a bushing configured to pass through a grounded conducting barrier, the bushing comprising:
   a body of insulating material;
   an electrical conductor extending in an axial direction entirely through the body;
   a passive electrical sensor embedded or integrated in the body of insulating material, the passive electrical sensor being configured to measure a voltage or current present in the electrical conductor; and
   a shielded connector with one or more terminals arranged on an outer surface of the body extending longitudinally out from the body in a radial direction, the shielded connector being electrically connected to the passive electrical sensor, the one or more terminals of the shielded connector being shielded from one or more electric fields; and
a connector cable, comprising:
   a printed circuit board having electrical components and a first shielded connector arranged thereon;
   a second shielded connector with one or more terminals configured to connect with an appliance or a further connector cable, the one or more terminals of the second shielded connector being shielded from the one or more electric fields;
   an elongate housing configured to house the electrical components and shield the electrical components from the one or more electric fields,
wherein the first shielded connector has one or more terminals configured to connect with the at least one shielded connector, the one or more terminals of the first shielded connector being shielded from the one or more electric fields,
wherein the electrical components are arranged on the printed circuit board adjacent to the first shielded connector and electrically connected to the terminals of the first shielded connector, the electrical components being electrically connected via a flexible cable to the terminals of the second shielded connector,
wherein the first shielded connector is arranged at one end of the housing,
wherein the flexible cable is arranged at the other end of the housing,
wherein the electrical components are electrically coupled to the passive electrical sensor via the one or more terminals of the first shielded connector and the one or more terminals of the shielded connector.

16. The combination according to claim 15,
wherein the passive electrical sensor comprises a Rogowski coil,
wherein each end of the Rogowski coil is electrically connected to a separate one of the terminals of the shielded connector,
wherein windings of the Rogowski coil are arranged on a second printed circuit board, and
wherein the at least one shielded connector is arranged on the second printed circuit board,
wherein the electrical components comprise an amplifier configured to amplify a signal received from the Rogowski coil.

17. The combination according to claim 15,
wherein the passive electrical sensor comprises a primary part of a capacitive voltage divider, the primary part comprising:
   a cylindrical electrical screen arranged concentrically around and spaced apart from the electrical conductor, the electrical screen being electrically connected to one of the terminals of the shielded connector, and wherein the electrical components comprise a secondary part of the capacitive voltage divider.

* * * * *